United States Patent
Kraus

(10) Patent No.: US 7,479,791 B2
(45) Date of Patent: Jan. 20, 2009

(54) CIRCUIT ARRANGEMENT FOR A CAPACITIVE PROXIMITY SWITCH

(75) Inventor: Randolf Kraus, Bretten (DE)

(73) Assignee: E.G.O. Elektro-Geraetebau GmbH (DE)

( * ) Notice: Subject to any disclaimer, the term of this patent is extended or adjusted under 35 U.S.C. 154(b) by 0 days.

(21) Appl. No.: 10/543,115

(22) PCT Filed: Jan. 15, 2004

(86) PCT No.: PCT/EP2004/000236

§ 371 (c)(1),
(2), (4) Date: Feb. 17, 2006

(87) PCT Pub. No.: WO2004/066498

PCT Pub. Date: Aug. 5, 2004

(65) Prior Publication Data

US 2006/0238233 A1    Oct. 26, 2006

(30) Foreign Application Priority Data

Jan. 24, 2003   (DE) ............................... 103 03 480

(51) Int. Cl.
*G01R 27/26* (2006.01)
*H03K 17/955* (2006.01)
(52) U.S. Cl. .................. 324/678; 324/687; 327/517
(58) Field of Classification Search .......... 324/678, 324/687; 327/399, 517
See application file for complete search history.

(56) References Cited

U.S. PATENT DOCUMENTS 4,345,167 A    8/1982   Calvin
4,743,837 A  * 5/1988   Herzog ................. 324/611
5,917,165 A    6/1999   Platt et al.
5,973,417 A    10/1999  Goetz et al.
6,194,903 B1   2/2001   Schulz
6,362,632 B1   3/2002   Livingston
6,466,036 B1 * 10/2002  Philipp ................. 324/678
6,518,820 B2 * 2/2003   Gremm ................. 327/432
7,205,777 B2 * 4/2007   Schulz et al. .......... 324/661
2001/0019228 A1 9/2001  Gremm

FOREIGN PATENT DOCUMENTS

DE    195 28 454 C1    8/1996
DE    197 44 152 A1    4/1999
DE    199 07 214 A1    8/2000

* cited by examiner

*Primary Examiner*—Diego Gutierrez
*Assistant Examiner*—John Zhu
(74) *Attorney, Agent, or Firm*—Akerman Senterfitt

(57) ABSTRACT

Disclosed is a charge transfer-based circuit arrangement for capacitive proximity switches comprising a capacitive sensor element (C3), the capacity of which changes according to the actuation mode. The circuit arrangement includes a central capacitor (C2), a first controllable connecting means (D2) that impinges the capacitive sensor element with a charging voltage (U3) according to a triggering signal, and a second controllable connecting means (T1) which connects the capacitive sensor element to the central capacitor according to the triggering signal in order to transfer the charge from the capacitive sensor element to the central capacitor. The charging voltage can be an AC voltage while the connecting means can be impinged upon by the AC voltage in such a way that the first connecting means or the second connecting means is alternately conductive.

11 Claims, 3 Drawing Sheets

CIRCUIT ARRANGEMENT FOR A CAPACITIVE PROXIMITY SWITCH

FIELD OF USE AND PRIOR ART

The invention relates to a circuit arrangement for a capacitive proximity switch. Particularly, this proximity switch is working according to the charge transfer principle.

Circuit arrangements of this type are known and have, for example in the case of U.S. Pat. No. 5,973,417, a capacitive sensor element, whose capacitance changes as a function of its operating state. This capacitance change is evaluated in order to establish the operating state. For this purpose a charging voltage is supplied to the sensor element, so that as a function of its capacitance and the charging voltage, a specific electric charge is transferred to the sensor element. Following the charging time the sensor element is separated from the charging voltage and connected to a collecting or central capacitor, so that there is a charge transfer from the sensor element to the central capacitor. The charging and subsequent recharging process is repeated for a predetermined number of cycles, so that the charging of the central capacitor reaches a specific value, which inter alia is determined by the sensor element capacitance value. The charging or resulting voltage of the central capacitor is consequently a measure of the sensor element capacitance to be measured. By evaluating the voltage of the central capacitor, conclusions can be drawn concerning the operating state of the proximity switch. Following voltage evaluation the central capacitor is discharged in a defined manner and a new measuring cycle can follow.

The switching processes are normally implemented by analog switches, which are relatively expensive. The sensor element can also only be discharged to the instantaneous voltage of the central capacitor, so that the transferable charge decreases with increasing central capacitor charging and consequently the signal resolution is reduced.

PROBLEM AND SOLUTION

The problem of the invention is to provide a circuit arrangement of the aforementioned type ensuring a reliable determination of the operating state of the proximity switch under all operating conditions, which is inexpensive to manufacture and insensitive to EMC and HF disturbances and interference.

The invention solves this problem by a circuit arrangement having a capacitive sensor element, whose capacitance changes as a function of said operating state. The circuit includes a central capacitor, a first controllable connecting means which, as a function of a triggering signal, supplies a charging voltage to said capacitive sensor element, and a second controllable connecting means, which, as a function of said triggering signal, connects said capacitive sensor element to said central capacitor for a transfer of charge from said capacitive sensor element to said central capacitor. The charging voltage is an AC voltage and the AC voltage is supplied to the connecting means as the triggering signal in such a way that, in alternating manner, the first connecting means or the second connecting means is conductive. Advantageous and preferred developments of the invention will be further explained hereinafter. By express reference the wording of the claims is made into part of the content of the description.

The circuit arrangement according to the invention comprises a first controllable connecting means which, as a function of a triggering signal, supplies a charging voltage to a capacitive sensor element, and a second controllable connecting means which, as a function of the triggering signal, links the capacitive sensor element with a central capacitor for transferring the charge from the capacitive sensor element to the central capacitor. The charging voltage is an AC voltage and the connecting means can be supplied with the AC voltage in such a way that in alternating manner the first or second connecting means are conductive. The switching between a charging phase of the sensor element and the charge transfer phase takes place in the cycle of the AC voltage, so that there is no need for additional switching logics. Such a circuit arrangement is easy to construct, inexpensive to manufacture and insensitive to interference.

According to a further development of the circuit arrangement, the charging voltage is generated with the aid of a DC voltage source and a square-wave voltage source with a common reference potential. Between a charging voltage node and the DC voltage source is looped in a clamping diode in the blocking direction and between the charging voltage node and the square-wave voltage source are looped in a capacitor and a resistor in series. As a result of such an arrangement it is possible to generate a square-wave charging voltage at the charging voltage node, which alternates between the potential of the DC voltage source and a total potential of the potentials of the DC voltage source and the "1" level or potential of the square-wave voltage in the cycle of the square-wave voltage source. This allows an approximately complete charging/discharging of the sensor element independently of the charging voltage or charging state of the central capacitor, which leads to a linear voltage rise at the central capacitor. This leads to a marked increase in the possible signal resolution.

According to a further development of the circuit arrangement, the first connecting means is a diode and/or the second connecting means a bipolar transistor, particularly a pnp transistor. With the aid of this choice of connecting means it is easily and inexpensively possible to implement a switching function as a function of the charging voltage, because the connecting means are conductive or non-conductive depending on the charging voltage. There is no need for expensive, sensitive analog switches. In addition, a basic capacitance typical for capacitive sensor elements is largely compensated by the parasitic transistor capacitances, so that essentially only the capacitance change of the sensor element is detected.

According to a further development of the circuit arrangement, the base of the transistor and/or the anode of the diode is connected to the charging voltage node, the cathode of the diode and/or the emitter of the transistor is connected to a filter resistor, which is coupled to the capacitive sensor element, and the collector of the transistor is connected to the central capacitor, whose other terminal is connected to a reference voltage. As a result of this wiring system, the diode/transistor are alternately conductive as a function of the charging voltage and further control signals are unnecessary. The filter resistor makes the circuit arrangement insensitive to EMC and HF interference.

According to a further development of the circuit arrangement, a switch is connected in parallel to the central capacitor permitting a reliable discharging of said central capacitor prior to the start of a new measurement. Alternatively a suitably dimensioned resistor can be used.

According to a further development of the circuit arrangement, the latter has several capacitive sensor elements, with each of which is associated a first and a second connecting means and a single central capacitor, which is connected to the particular second connecting means via in each case a decoupling diode in the conducting direction, the anode of the decoupling diode being connected by a selection diode in the conducting direction to a particular selection signal. It is possible with the aid of such a circuit arrangement to evaluate the operating state of several proximity switches in multiplex operation. The choice of the corresponding proximity switch takes place through the selection signal by which the charge transfer from the selected sensor element to the single central capacitor is released. The charge of the unselected sensor elements flows away across the particular selection diode. The charging voltage can be made centrally available.

According to a further development of the circuit arrangement, the capacitive sensor element is constructed to be applied to an underside of a surface or cover having dielectric characteristics and preferably has a smooth, planar surface for engagement purposes.

According to a further development of the circuit arrangement, the capacitive sensor element is a voluminous, elastic, preferably elongated body made from electrically conductive material. Such a sensor element is for example described in U.S. Pat. No. 5,917,165, whose content is, by express reference, made into part of that of the present description.

These and further features can be gathered from the claims, description and drawings and the individual features, either singly or in the form of subcombinations, can be implemented in an embodiment of the invention and in other fields and can represent advantageous, independently protectable constructions for which protection is claimed here. The subdivision of the application into individual sections and the subheadings in no way restricts the general validity of the statements made thereunder.

BRIEF DESCRIPTION OF THE DRAWINGS

Advantageous embodiments of the invention are diagrammatically shown in the following drawings, wherein represent.

DETAILED DESCRIPTION OF EMBODIMENTS

Figure 1:
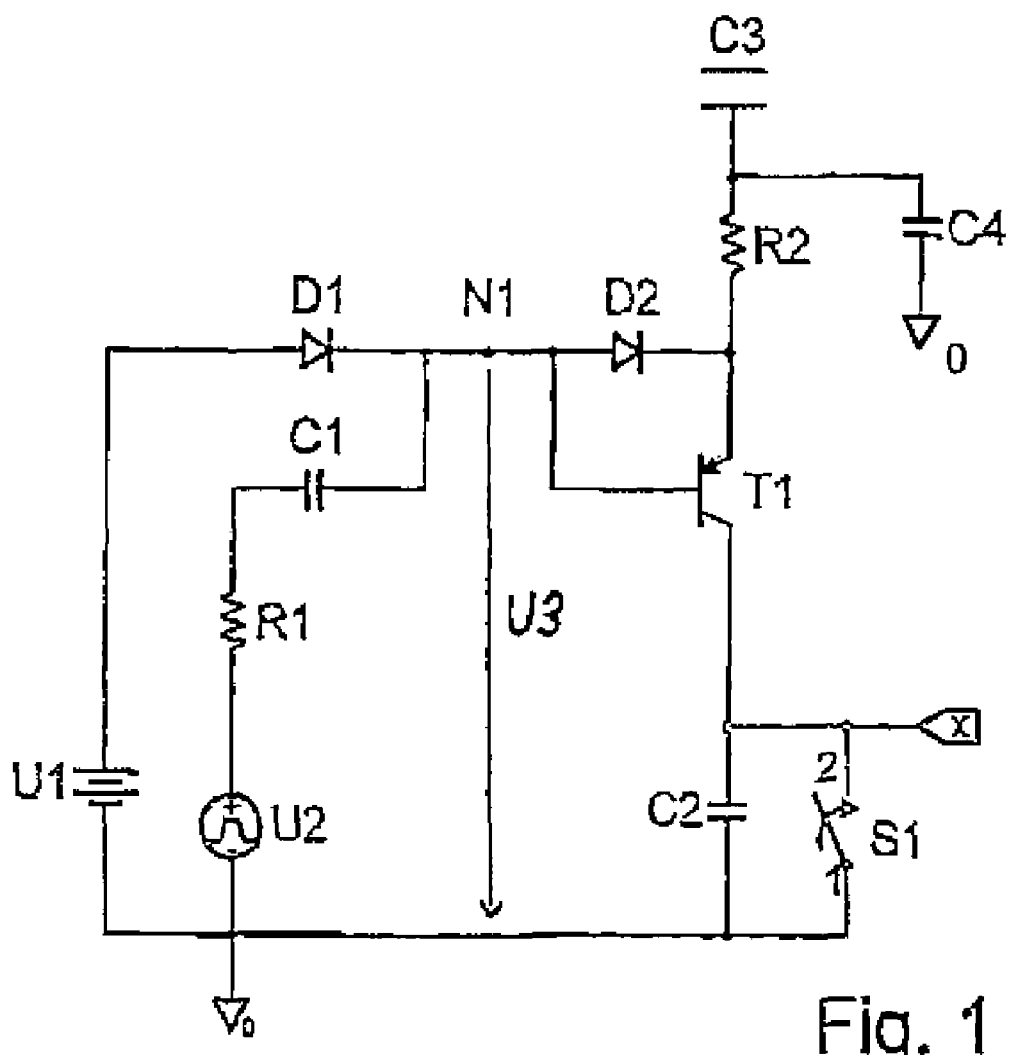
FIG. 1 A circuit diagram of a circuit arrangement for capacitive proximity switches for the determination of their operating state.
Figure 1:
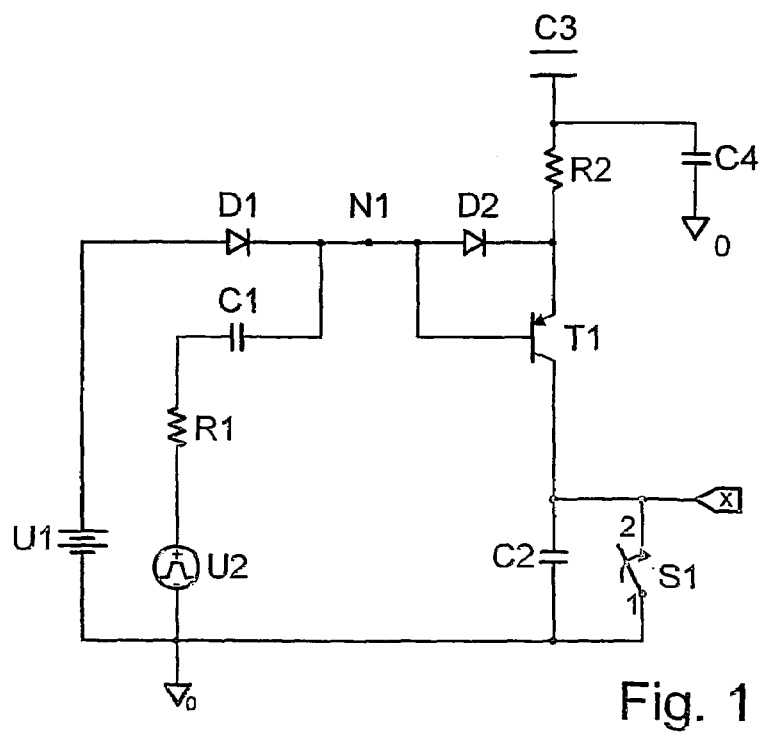
Figure 2:
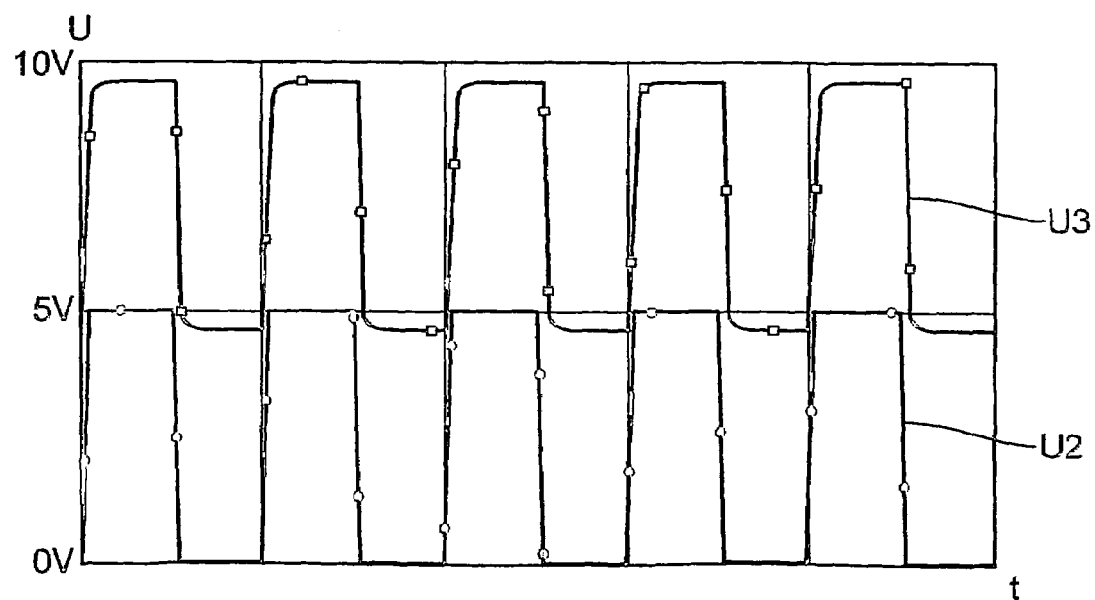
FIG. 2 A graph of the voltage curve of an AC voltage source U2 of FIG. 1 and a charging voltage at a charging voltage node N1 of FIG. 1.

FIG. 1 is a diagram of a circuit arrangement for capacitive proximity switches for the determination of their operating state. The circuit arrangement comprises a DC voltage source U1 and a square-wave voltage source U2 with a common reference potential, for example earth, and between the charging voltage node N1 to which a charging voltage is applied and the DC voltage source U1 is looped a clamping diode 1 in the non-conducting direction and between the charging voltage node N1 and square-wave voltage source U1 are looped in a capacitor C1 and a resistor 1 in series. In conjunction with the capacitor C1, the clamping diode D1 brings about a raising of the voltage at node N1 outputted by the square-wave voltage source U1 by the amount of the voltage of said source. FIG. 2 shows this in a graph of the voltage curve of the AC voltage source U2 and the charging voltage U3 at the charging voltage node N1 over time.

There is also a first switching means in the form of a diode D2 and a second switching means in the form of a pnp transistor T1. The base of the transistor T1 and the anode of diode D2 are connected to the charging voltage node N1. The cathode of diode D2 and the emitter of transistor T1 are connected to a filter resistor R2, which is coupled to the capacitive sensor element C3, and the collector of transistor T1 is connected to a collecting or central capacitor C2, whose other terminal is connected to the reference potential.

A capacitor C4 represents a substantially constant basic capacitance of the sensor element C3. A switch S1 is connected in parallel to the central capacitor C2 and is closed as from the start of the measurement and consequently said capacitor is completely discharged. If the voltage curve at this central capacitor is evaluated by a microcontroller, it can discharge the central capacitor C2 prior to the start of the measurement if the corresponding input is briefly switched to the reference potential. There is no switch S1 in this case. The capacitive sensor element C3 is for example applied to an underside of a surface or cover having dielectric characteristics.

The diode D2 and base of transistor T1 are supplied with the charging voltage U3, so that in alternating manner diode D2 or transistor T1 is conductive. If the charging voltage U3 has its higher value diode D2 becomes conductive, so that the capacitance of the sensor element C3 is charged roughly to the amount of the charging voltage. In this case the transistor is blocked, because its base-emitter voltage is positive. If the charging voltage U3 drops to its lower value, the diode D2 is blocked and the base-emitter junction becomes conductive, i.e. the transistor T1 switches through. Consequently the charge of the sensor element C3 is recharged or transferred to the central capacitor. The parasitic transistor capacitances of transistor T1 compensate part of the basic capacitance C4 of sensor element C3, so that essentially only the capacitance change of the sensor element C3 is detected.

The recharged charge quantity is determined by the sensor element capacitance C3 to be established. On operating the proximity switch the capacitance C3 rises, so that the voltage rises more rapidly at the central capacitor.

Figure 3:
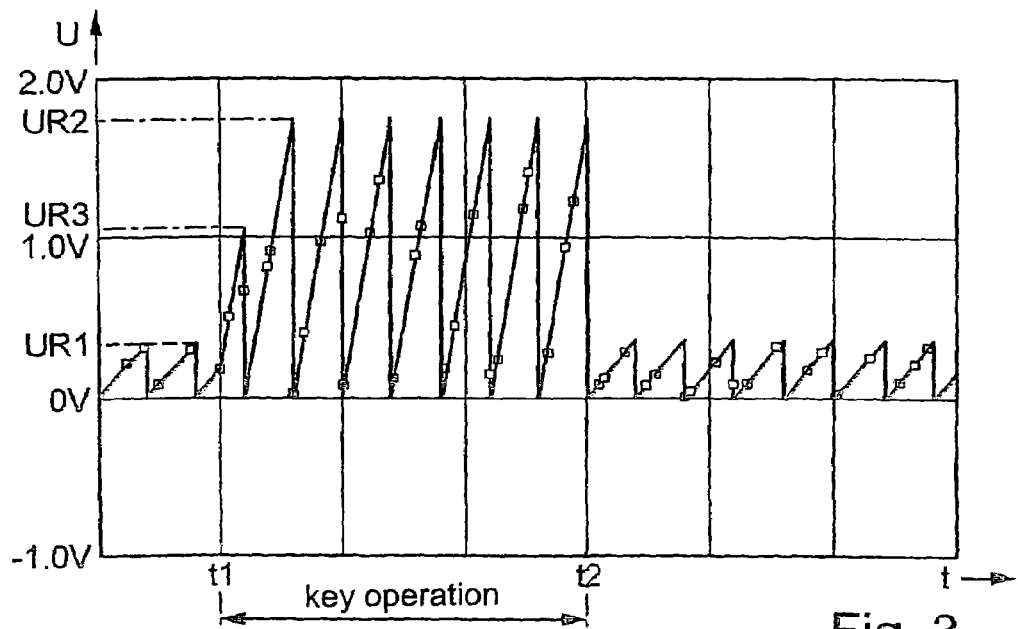
FIG. 3 A graph of the voltage curve at a central capacitor C2 of FIG. 1 as a function of the operating state of a proximity switch.

FIG. 3 is a graph of the voltage curve at the central capacitor C2 as a function of the operating state of the proximity switch over time. When the proximity switch is not operated, there is a sawtooth-shaped voltage configuration between the reference voltage and a first ramp voltage UR1. In a period between times t1 and t2 with the proximity switch operated, at time t1 the ramp rise increases sharply and the voltage at central capacitor C2 rises to a ramp voltage UR3. The following measuring cycles take place up to time t2 with a considerable ramp rise, so that in each case a ramp voltage UR2 is reached. The ramp voltage reached consequently indicates the operating state of the proximity switch and can be evaluated by a not shown unit, for example a microcontroller.

Figure 4:
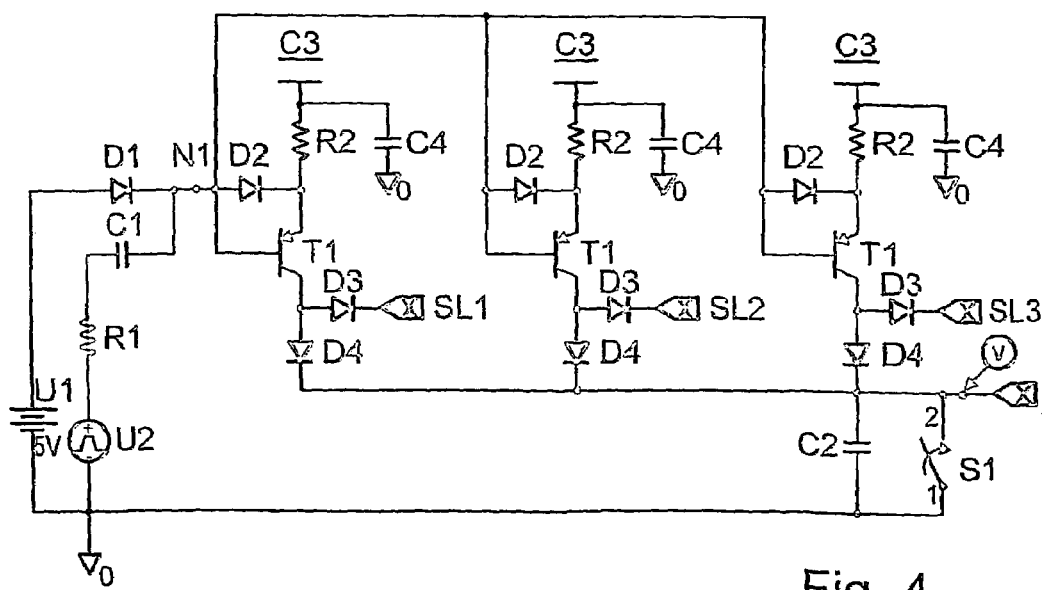
FIG. 4 A circuit diagram of a circuit arrangement with several capacitive sensor elements.

FIG. 4 shows a diagram of a circuit arrangement with three capacitive sensor elements C3, with each of which is associated as connecting means a diode D2 and a transistor T1. The switching part for generating the charging voltage comprising the voltage sources U1, U2, the clamping diode D1, the capacitor C1 and the resistor R1 are only present once and supply the particular connecting means with the charging voltage U3. The central capacitor C2 is also only present once. The diodes D3, D4, which are connected to the collector of transistor T2, are used for mutual coupling purposes. The choice of a proximity switch to be measured takes place with the aid of the corresponding selection signal SL1, SL2 or SL3. The selection signal SL of the selected proximity switch carries a voltage higher than the maximum ramp voltage which occurs and the selection signal of the non-selected proximity switch carries the reference voltage. The charging of the unselected sensor element flows away across the particular diode D3, whereas the charge of the selected sensor element is transferred across the corresponding diode D4 into central capacitor C2.

The circuit arrangements shown permit the reliable determination of the operating state of the proximity switch or switches under all operating conditions, can be inexpensively manufactured and are insensitive to EMC and HF interference.

The invention claimed is:

1. A circuit arrangement for a capacitive proximity switch for the determination of an operating state and having:
    a capacitive sensor element, whose capacitance changes as a function of said operating state;
    a central capacitor;
    a first controllable connecting means which, as a function of a triggering signal, supplies a charging voltage to said capacitive sensor element; and
    a second controllable connecting means, which, as a function of said triggering signal, connects said capacitive sensor element to said central capacitor for a transfer of charge from said capacitive sensor element to said central capacitor,
    wherein said charging voltage is an AC voltage supplied from an AC voltage source and said AC voltage is supplied to said connecting means as the triggering signal in such a way that, in alternating manner, said first connecting means or said second connecting means is conductive.

2. The circuit arrangement according to claim 1, wherein said charging voltage is generated with the aid of a DC voltage source and a square-wave voltage source with a common reference potential, a clamping diode being looped in the conducting direction between a charging voltage node and said DC voltage source and a capacitor and a resistor are looped in series between said charging voltage node and said square-wave voltage source.

3. The circuit arrangement according to claim 1, wherein said first connecting means is a diode.

4. The circuit arrangement according to claim 3, wherein an anode of said diode is connected to said charging voltage node and that a cathode of said diode is connected to a filter resistor, which is coupled to said capacitive sensor element.

5. The circuit arrangement according to claim 1, wherein a switch is connected in parallel to the central capacitor.

6. The circuit arrangement according to claim 1, wherein it has several capacitive sensor elements, wherein with each of which is associated a first and a second connecting means, and only has one single central capacitor, which is connected in a conducting direction across in each case one decoupling diode to the particular second connecting means, said anode of said decoupling diode being connected by a selection diode in said conducting direction with a selection signal.

7. The circuit arrangement according to claim 1, wherein said capacitive sensor element is constructed for application to an underside of a surface or a cover having dielectric characteristics.

8. The circuit arrangement according to claim 1, wherein said capacitive sensor element is a voluminous, elastic, elongated body of electrically conductive material.

9. The circuit arrangement according to claim 1, wherein said second connecting means is a bipolar transistor.

10. The circuit arrangement according to claim 9, wherein a base of said transistor is connected to said charging voltage node, that an emitter of said transistor is connected to a filter resistor, which is coupled to said capacitive sensor element and that a collector of said transistor is connected to said central capacitor whose other terminal is connected to a reference voltage.

11. The circuit arrangement according to claim 7, wherein said capacitive sensor element has a smooth, planar surface for engagement purposes.

* * * * *